(12) United States Patent
Ishii

(10) Patent No.: US 11,569,727 B2
(45) Date of Patent: Jan. 31, 2023

(54) DRIVE CIRCUIT AND POWER CONVERSION DEVICE

(71) Applicant: Mitsubishi Electric Corporation, Tokyo (JP)

(72) Inventor: Yuki Ishii, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 156 days.

(21) Appl. No.: 17/054,786

(22) PCT Filed: Jul. 16, 2019

(86) PCT No.: PCT/JP2019/027950
§ 371 (c)(1),
(2) Date: Nov. 12, 2020

(87) PCT Pub. No.: WO2020/017506
PCT Pub. Date: Jan. 23, 2020

(65) Prior Publication Data
US 2021/0234454 A1    Jul. 29, 2021

(30) Foreign Application Priority Data
Jul. 17, 2018 (JP) .............................. JP2018-134164

(51) Int. Cl.
*H02M 1/08* (2006.01)
*H02M 1/36* (2007.01)
*H02M 7/483* (2007.01)

(52) U.S. Cl.
CPC .............. *H02M 1/08* (2013.01); *H02M 1/36* (2013.01); *H02M 7/4835* (2021.05)

(58) Field of Classification Search
CPC ....................................................... H02M 1/36
See application file for complete search history.

(56) References Cited

U.S. PATENT DOCUMENTS

| 9,929,652 B1* | 3/2018 | Ribarich | ................ H02M 3/158 |
| 10,622,994 B2* | 4/2020 | Havanur | ............ H03K 17/6872 |
| 2006/0220631 A1* | 10/2006 | Ito | ........................... H03K 17/22 |
| | | | 323/283 |

(Continued)

FOREIGN PATENT DOCUMENTS

JP    10-285909 A    10/1998

OTHER PUBLICATIONS

Extended European Search Report dated Jul. 27, 2021, in corresponding European Patent Application No. 19837566.9.

(Continued)

*Primary Examiner* — Gustavo A Rosario-Benitez
(74) *Attorney, Agent, or Firm* — Xsensus LLP

(57) ABSTRACT

A current path to a gate is cut off by a normally-off first switch element until start-up of a gate drive voltage generator is sensed. Furthermore, a semiconductor switching element is maintained in an off state as a normally-on second switch element short-circuits the gate to a source. As start-up of the gate drive voltage generator is sensed, the second switch element is turned off and the first switch element is turned on. As the gate is thus driven by an output from a signal amplifier in accordance with a control signal, the semiconductor switching element is turned on and off in accordance with the control signal.

11 Claims, 6 Drawing Sheets

(56) References Cited

U.S. PATENT DOCUMENTS

| | | | | |
|---|---|---|---|---|
| 2012/0146613 A1* | 6/2012 | Hamanaka | ......... | H03K 17/6877 |
| | | | | 323/311 |
| 2012/0249020 A1* | 10/2012 | Komatsu | ................ | H02M 1/32 |
| | | | | 327/109 |
| 2014/0375284 A1* | 12/2014 | Guo | ................... | H03K 17/0822 |
| | | | | 323/266 |
| 2015/0263602 A1* | 9/2015 | Drda | ....................... | H02M 1/08 |
| | | | | 363/21.02 |
| 2017/0040992 A1 | 2/2017 | Nakano et al. | | |
| 2017/0302151 A1* | 10/2017 | Snook | .................. | H03K 17/168 |
| 2018/0131365 A1* | 5/2018 | Zojer | ................... | H03K 17/163 |
| 2018/0287544 A1* | 10/2018 | Kato | ....................... | H02M 1/38 |
| 2018/0316279 A1* | 11/2018 | Imura | ..................... | H02M 1/36 |
| 2019/0199343 A1* | 6/2019 | Araragi | ............... | H03K 17/162 |

OTHER PUBLICATIONS

International Search Report and Written Opinion dated Oct. 8, 2019 for PCT/JP2019/027950 filed on filed Jul. 16, 2019, 8 pages including English Translation of the International Search Report.

\* cited by examiner

DRIVE CIRCUIT AND POWER CONVERSION DEVICE

CROSS-REFERENCE TO RELATED APPLICATION

The present application is based on PCT filing PCT/JP2019/027950, filed Jul. 16, 2019, which claims priority to JP 2018-134164, filed Jul. 17, 2018, the entire contents of each are incorporated herein by reference.

TECHNICAL FIELD

The present disclosure relates to a drive circuit and a power conversion device, and more particularly to a drive circuit that drives a semiconductor switching element and a power conversion device including the drive circuit.

BACKGROUND ART

In a power conversion device, in order to control turn-on and turn-off of a semiconductor switching element provided in a main circuit, a drive circuit that drives a control electrode of the semiconductor switching element (which is also called a "gate drive circuit") is employed. In the power conversion device, a control power supply that supplies electric power to the drive circuit and a circuit that constructs another control system is provided. For the control power supply, a scheme for supplying electric power from a main circuit of the power conversion device has generally been adopted.

For example, in a self-supply gate circuit described in Japanese Patent Laying-Open No. 10-285909 (PTL 1) in which control power is supplied by turning on a main power supply, a switch that short-circuits a gate portion of a semiconductor switching element for a period until control power supply is established after turn-on of the main power supply is arranged. As the control power supply is established, the switch is opened to cancel short-circuiting of the gate portion. False turn-on that leads to deterioration of an element due to increase in gate voltage of a voltage-driven element by a charging current for a parasitic capacitance during a period for which the control power supply has not been established can be prevented.

CITATION LIST

Patent Literature

PTL 1: Japanese Patent Laying-Open No. 10-285909

SUMMARY OF INVENTION

Technical Problem

In the gate circuit in PTL 1, however, during the period for which the control power supply has not yet been established, the switch short-circuits a gate and an emitter of the semiconductor switching element configured with an insulated gate bipolar transistor (IGBT). Therefore, an output of a drive amplifier that supplies a gate current is kept connected to the emitter terminal of the semiconductor switching element with a gate resistor being interposed.

At this time, when supply of electric power to the gate circuit starts to start start-up of a power supply system of the gate circuit and a gate voltage starts to rise, a current flows through the gate resistor in accordance with the voltage applied to an output node of the drive amplifier, which results in power loss. Though a gate resistance value is determined to adjust a condition for driving the semiconductor switching element, it may also be as small as approximately several ohms (Ω). In such a case, power loss caused at the gate resistor during the period for which the control power supply has not yet been established may be expected to attain to several ten watts (W) or more. There is concern that such large power loss at the gate resistor is a cause for defective start-up of the power supply system of the gate circuit.

The present disclosure was made to solve such a problem, and an object of the present disclosure is to prevent occurrence of power loss and false turn-on of a semiconductor switching element at the time of start-up of a power supply in a drive circuit that drives a control electrode of the semiconductor switching element.

Solution to Problem

According to one aspect of the present disclosure, a drive circuit that drives a control electrode of a semiconductor switching element includes a drive voltage generator, a signal amplifier, a resistive element, first and second switch elements, and a start-up sensor. The drive voltage generator generates a drive voltage to be used for driving the control electrode from a voltage supplied from a power supply outside the drive circuit. The signal amplifier amplifies a control signal for control of turn-on and turn-off of the semiconductor switching element and outputs the amplified control signal. The resistive element is connected between an output terminal connected to the control electrode and an output node of the signal amplifier. The first switch element is connected in series to the resistive element between the output node and the output terminal. The second switch element short-circuits the output terminal when it is turned on. The start-up sensor outputs an electrical signal when it senses start-up of the drive voltage generator. The first switch element is configured with a normally-off switch that is turned on while the electrical signal is output. The second switch element is configured with a normally-on switch that is turned off while the electrical signal is output.

Advantageous Effects of Invention

According to the present disclosure, in the drive circuit that drives the control electrode of the semiconductor switching element, a current path to the control electrode that is short-circuited for prevention of false turn-on can be cut off until start-up of the control power supply is sensed. Therefore, occurrence of power loss and false turn-on of the semiconductor switching element can be prevented.

DESCRIPTION OF EMBODIMENTS

Figure 1:
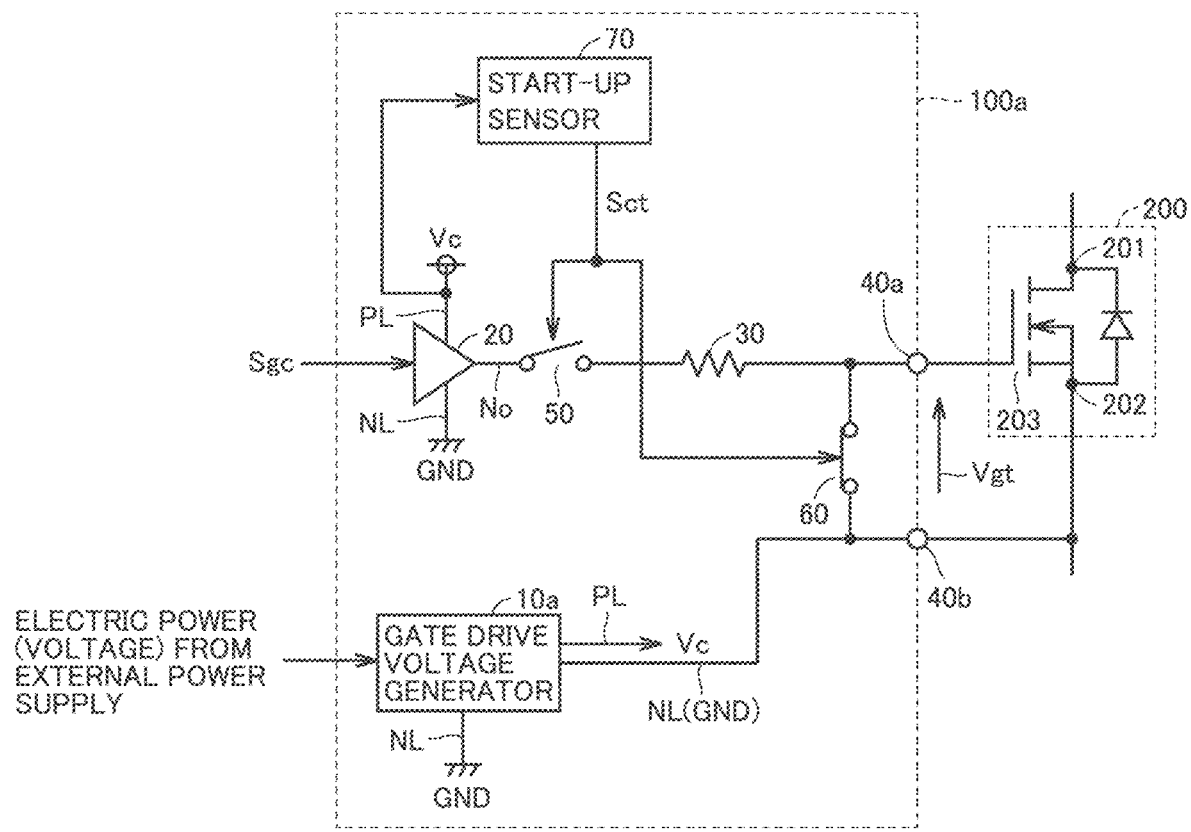
FIG. 1 is a block diagram showing a configuration of a drive circuit according to a first embodiment.

An embodiment of the present disclosure will be described below in detail with reference to the drawings. The same or corresponding elements in the drawings below have the same reference characters allotted and description thereof will not be repeated in principle.

First Embodiment

FIG. 1 is a block diagram illustrating a configuration of a drive circuit according to a first embodiment.

Referring to FIG. 1, a drive circuit 100a turns on and off a semiconductor switching element 200 in accordance with a control signal Sgc generated by a not-shown control circuit.

Semiconductor switching element 200 includes a positive electrode 201, a negative electrode 202, and a control electrode 203, and it is controlled to one of an on state in which a current path is formed between positive electrode 201 and negative electrode 202 and an off state in which the current path is cut off, in accordance with a voltage or a current of control electrode 203.

In the present embodiment, an example in which semiconductor switching element 200 is configured with a metal oxide semiconductor field effect transistor (MOSFET) which is a voltage-driven element will be described. In the MOSFET, positive electrode 201 serves as a drain, negative electrode 202 serves as a source, and control electrode 203 serves as a gate. Positive electrode 201, negative electrode 202, and control electrode 203 are also referred to below as drain 201, source 202, and gate 203, respectively. When semiconductor switching element 200 is configured with an insulated gate bipolar transistor (IGBT), positive electrode 201 serves as a collector, negative electrode 202 serves as an emitter, and control electrode 203 serves as a gate.

Control signal Sgc is also referred to as a gate control signal Sgc. Drive circuit 100a outputs a voltage and a current that drive gate 203 to turn on and off semiconductor switching element 200 in accordance with gate control signal Sgc. As is known, semiconductor switching element 200 is turned on when a gate voltage Vgt which is a voltage of gate 203 with respect to source 202 is higher than a threshold voltage (Vth). When gate voltage Vgt is lower than the threshold voltage (Vth), semiconductor switching element 200 is turned off.

Drive circuit 100a according to the first embodiment includes a gate drive voltage generator 10a, a gate signal amplifier 20, a gate resistor 30, a gate output terminal 40a, a source output terminal 40b, switch elements 50 and 60 that are complementarily turned on and off, and a start-up sensor 70.

Gate drive voltage generator 10a is connected to a low-voltage side power supply line NL and a high-voltage side power supply line PL, and generates a gate drive voltage Vc from electric power supplied from a power supply outside drive circuit 100a (which is referred to as an "external power supply" below). Gate drive voltage generator 10a outputs gate drive voltage Vc to high-voltage side power supply line PL. In the first embodiment, low-voltage side power supply line NL corresponds to a reference potential line for supplying a reference voltage (GND here). The reference voltage corresponds to a voltage of source 202.

For example, when the external power supply supplies AC power, gate drive voltage generator 10a can be configured with an AC/DC converter. A known technique such as a half-wave rectifier circuit or a full-wave rectifier circuit including a diode or a pulse width modulation (PWM) rectifier circuit including a semiconductor switching element can be applied to the AC/DC converter.

When the external power supply supplies DC power, gate drive voltage generator 10a can be configured with a DC/DC converter. A known technique such as a shunt regulator, a series regulator, or a switching regulator including a semiconductor switching element can be applied to the DC/DC converter.

Gate signal amplifier 20 amplifies gate control signal Sgc to a voltage and a current sufficient for driving gate 203 and outputs the amplified gate control signal to an output node No. Gate signal amplifier 20 can be configured, for example, with a push-pull type amplifier circuit. Alternatively, when gate control signal Sgc received from the outside is an optical signal, gate signal amplifier 20 is configured to have a light reception element disposed in its input stage and to perform a function to photoelectrically convert the received optical signal (gate control signal Sgc).

Gate output terminal 40a is connected to gate 203 of semiconductor switching element 200. Source output terminal 40b is connected to the reference potential line (low-voltage side power supply line NL here) and source 202 of semiconductor switching element 200. Gate resistor 30 and normally-off switch element 50 are connected in series to each other between output node No of gate signal amplifier 20 and gate output terminal 40a.

A resistance value of gate resistor 30 is determined in consideration of a switching characteristic of semiconductor switching element 200 to be driven by drive circuit 100a. In general, a resistance value approximately from several ohms (Ω) to several ten ohms (Ω) is adopted. Though a configuration in which single gate resistor 30 is arranged is illustrated for simplification of description in the present embodiment, gate resistor 30 may be configured such that a gate resistance value is switched between a value at the time of turn-on and a value at the time of turn-off. For example, the gate resistance value can be switched by combining two resistive elements different in resistance value and at least one switching element.

Switch element 50 can be configured with a normally-off semiconductor switch or a mechanical switch. Switch element 50 is turned on while an electrical signal Sct is output from start-up sensor 70, whereas it is turned off while electrical signal Sct is not output.

Normally-on switch element 60 is connected between gate output terminal 40a and source output terminal 40b. Switch element 60 can be configured with a normally-on semiconductor switch or a mechanical switch. Switch element 60 is turned off while electrical signal Sct is output from start-up sensor 70, whereas it is turned on while electrical signal Sct is not output. While switch element 60 is on, gate 203 and source 202 of semiconductor switching element 200 are equal in potential (GND) and gate 203 is short-circuited. Thus, during an on period of switch element 60, false turn-on can be prevented by reliably maintaining semiconductor switching element 200 in the off state.

Start-up sensor 70 receives as an input, a voltage of power supply line PL, that is, gate drive voltage Vc generated by gate drive voltage generator 10a. Start-up sensor 70 is configured, for example, with a comparator, and it compares gate drive voltage Vc with a predetermined criterion voltage Vt. When gate drive voltage Vc exceeds criterion voltage Vt, start-up sensor 70 senses start-up of gate drive voltage generator 10b (in other words, start-up of a control power supply) and outputs electrical signal Sct. While gate drive voltage Vc is lower than criterion voltage Vt, electrical signal Sct is not output.

An operation of drive circuit 100a according to the first embodiment at the time of start-up of the power supply will now be described with reference to FIG. 2.

Figure 2:
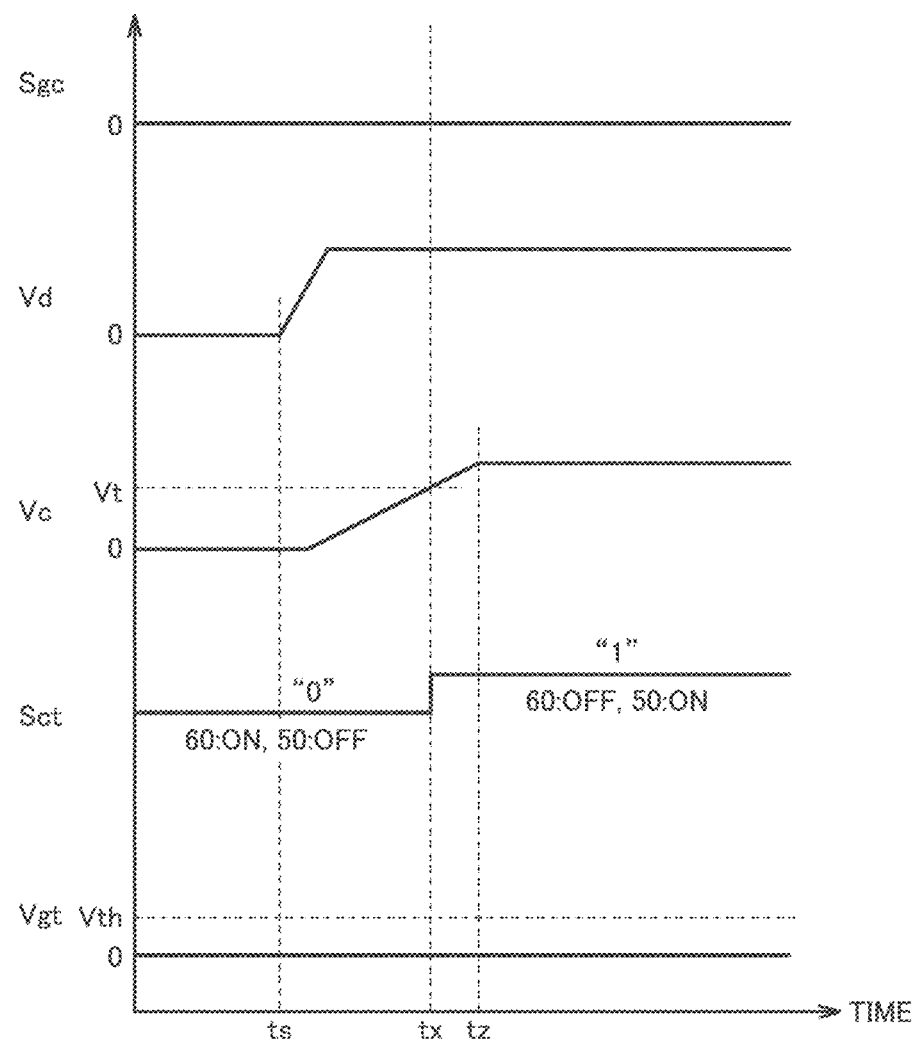
FIG. 2 is an operation waveform diagram at the time of start-up of the drive circuit shown in FIG. 1.

FIG. 2 is an operation waveform diagram at the time of start-up of drive circuit 100a shown in FIG. 1. FIG. 2 illustrates a waveform diagram when DC power (DC voltage Vd) is supplied from an external power supply to gate drive voltage generator 10a.

Referring to FIG. 2, when external supply of power is started at time ts, DC voltage Vd rises. Before time ts at which supply of power is started, gate drive voltage Vc has not been generated (Vc=0) and electrical signal Sct has not been generated either (Sct="0").

In response to supply of DC voltage Vd from time ts, gate drive voltage generator 10a starts generation of gate drive voltage Vc. Gate drive voltage Vc is thus increased and gate drive voltage Vc is increased to a rated value at time tz.

When gate drive voltage Vc exceeds criterion voltage Vt (Vt>0) at time tx (Vc>Vt), start-up sensor 70 senses start-up of gate drive voltage Vc and outputs electrical signal Sct (Sct="1"). During a period from time ts to time tx, electrical signal Sct is not output (Sct="0") either, similarly to a period before time ts.

Therefore, throughout a period before start of external supply of power (before time ts) and a period from start of supply of power until sensing of start-up of gate drive voltage generator 10a (from time ts to time tx), switch element 60 is maintained in the on state and switch element 50 is maintained in the off state. By thus short-circuiting gate 203 and source 202 of semiconductor switching element 200, semiconductor switching element 200 can be maintained in the off state. In particular, false turn-on of semiconductor switching element 200 due to increase in gate voltage Vgt caused by unintended charging of a gate capacitance by a feedback capacitance of semiconductor switching element 200 with start-up of the main circuit at the time of start-up of the power supply can be prevented.

Furthermore, occurrence of power loss due to opening of the output of gate signal amplifier 20 in response to turn-off of switch element 50 and a flow of a current through gate resistor 30 with start-up of gate drive voltage generator 10a can be prevented. As described in PTL 1, when gate drive voltage Vc is started up, a current path from the output node of gate signal amplifier 20 via gate resistor 30 and switch element 60 may be formed. Since gate resistor 30 generally has a resistance value approximately from several ohms (Ω) to several ten ohms (Ω) as described above, formation of such a current path may lead to occurrence of power loss equal to or higher than several ten watts (W) at gate resistor 30. There is concern that defective start-up of gate drive voltage generator 10a may occur due to this power loss.

In contrast, in the drive circuit according to the present first embodiment, during a period until start-up of the gate drive voltage generator is confirmed, switch element 50 in the off state cuts off the current path including gate resistor 30 to short-circuited gate 203. Consequently, occurrence of power loss at gate resistor 30 and occurrence of defective start-up of gate drive voltage generator 10a can be prevented.

Furthermore, after start-up of gate drive voltage generator 10a (after time tx), switch element 50 is turned on and switch element 60 is turned off. Consequently, in semiconductor switching element 200, gate 203 is disconnected from source 202 and electrically connected to the output node of gate signal amplifier 20.

Thus, gate voltage Vgt becomes controllable in accordance with the output from gate signal amplifier 20, and a state that semiconductor switching element 200 can be turned on and off in accordance with gate control signal Sgc, that is, a normal operating state of drive circuit 100a, is formed. During a period for which gate control signal Sgc="0" is output, a voltage (GND) of power supply line NL is output from gate signal amplifier 20. Thus, throughout a period before time tx and a period after time tx, gate voltage Vgt does not exceed threshold voltage Vth in response to gate control signal Sgc="0" and semiconductor switching element 200 is maintained in the off state without being falsely turned on.

Figure 3:
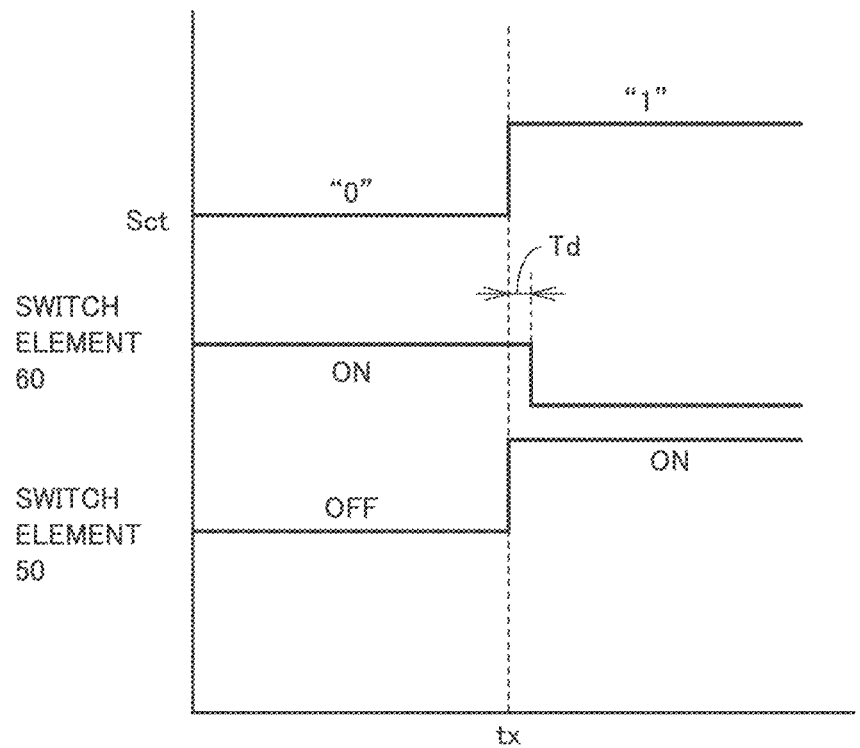
FIG. 3 is an operation waveform diagram for illustrating a dead time between switches shown in FIG. 1.

A dead time as shown in FIG. 3 may also be introduced in operations by switch elements 50 and 60 at the time of output of electrical signal Sct (time tx).

Referring to FIG. 3, after a state that electrical signal Sct is not output (Sct="0") and switch element 60 is on and switch element 50 is off, electrical signal Sct is output (Sct="1") and on and off of switch elements 50 and 60 are interchanged. Then, after lapse of a dead time Td after timing of transition from off to on of switch element 50, switch element 60 makes transition from on to off.

For example, the dead time as shown in FIG. 3 can be provided by transmitting electrical signal Sct output from start-up sensor 70 to switch element 60 via a delay circuit (not shown) that provides a delay time corresponding to dead time Td and transmitting electrical signal Sct to switch element 50 not via the delay circuit.

Contrary to FIG. 3, when switch element 50 is turned on after switch element 60 is turned off, both of switch elements 50 and 60 are turned off. Then, gate 203 of semiconductor switching element 200 is opened, and false turn-on of semiconductor switching element 200 may occur due to unintended charging of the gate capacitance described above.

In contrast, as shown in FIG. 3, by providing a dead time such that switch element 60 is turned off after turn-on of switch element 50, false turn-on of semiconductor switching element 200 can reliably be prevented, regardless of output from gate signal amplifier 20.

According to the drive circuit in the present first embodiment, by complementarily turning on and off switch elements 50 and 60, a current path to the control electrode (gate 203) short-circuited for prevention of false turn-on can be cut off until start-up of the control power supply is sensed. Consequently, power loss at the gate resistor at the time of start-up of the power supply and occurrence of defective start-up of the gate drive voltage generator as well as occurrence of false turn-on of the semiconductor switching element can be prevented. A highly reliable drive circuit can thus be configured.

Start-up sensor 70 can sense start-up of gate drive voltage generator 10a with a simplified configuration in accordance with comparison between gate drive voltage Vc and the criterion voltage.

Furthermore, by introducing the dead time described with reference to FIG. 3 into operations by switch elements 50 and 60 at the time when start-up of gate drive voltage Vc is sensed, a period for which gate 203 is open can be prevented from being produced. Therefore, false turn-on of the semiconductor switching element to be driven by the drive circuit can reliably be prevented.

In the first embodiment, gate drive voltage generator 10a corresponds to one embodiment of the "drive voltage generator" and gate drive voltage Vc corresponds to the "drive voltage." Gate signal amplifier 20 corresponds to the "signal amplifier," gate resistor 30 corresponds to the "resistive element," switch element 50 corresponds to the "first switch element," and switch element 60 corresponds to the "second switch element."

Second Embodiment

Figure 4:
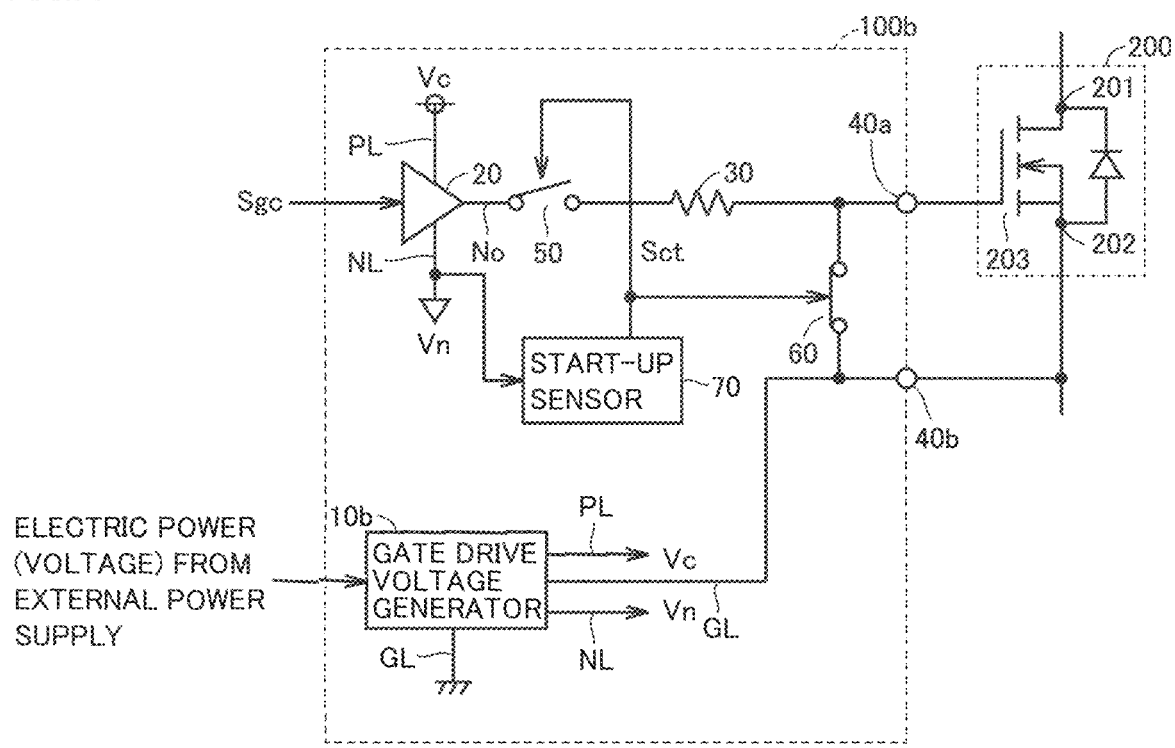
FIG. 4 is a block diagram illustrating a configuration of a drive circuit according to a second embodiment.

FIG. 4 is a block diagram illustrating a configuration of a drive circuit according to a second embodiment.

Referring to FIG. 4, a drive circuit 100b according to the second embodiment is different from drive circuit 100a according to the first embodiment in including a gate drive voltage generator 10b instead of gate drive voltage generator 10a (FIG. 1).

Gate drive voltage generator 10b further generates a gate drive voltage Vn for negative biasing for turning off semiconductor switching element 200, in addition to gate drive voltage Vc for positive biasing for turning on semiconductor switching element 200. For example, gate drive voltage generator 10b can be configured with two DC/DC converters for positive voltage generation and negative voltage generation. Gate drive voltage generator 10b outputs gate drive voltage Vc to power supply line PL whereas it outputs gate drive voltage Vn to power supply line NL.

In the second embodiment, gate drive voltage generator 10b is further connected to a reference potential line that supplies a reference voltage (for example, GND), separately from power supply lines PL and NL. Gate drive voltage Vc is higher than the reference voltage (GND) and gate drive voltage Vn is lower than the reference voltage (GND) (that is, a negative voltage). Source output terminal 40b is connected to the reference potential line (for example, GL) and source 202 of semiconductor switching element 200.

Start-up sensor 70 senses start-up of gate drive voltage generator 10b by receiving as input, a voltage of power supply line NL, that is, gate drive voltage Vn (negative voltage). When start-up sensor 70 senses start-up of gate drive voltage generator 10b, it outputs electrical signal Sct as in the first embodiment. Since drive circuit 100b according to the second embodiment is otherwise similar in configuration to drive circuit 100a according to the first embodiment, detailed description will not be repeated.

Figure 5:
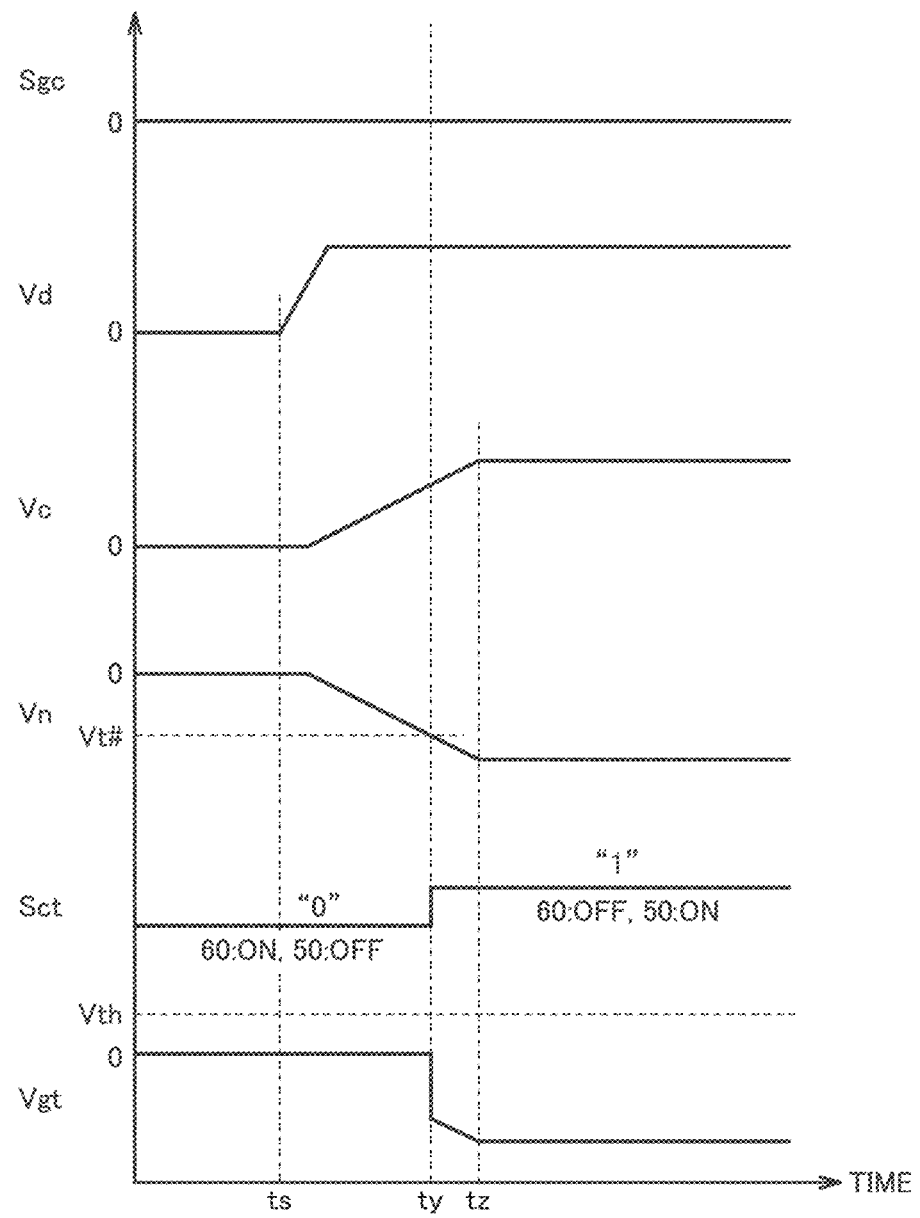
FIG. 5 is an operation waveform diagram at the time of start-up of the drive circuit shown in FIG. 4.

FIG. 5 is an operation waveform diagram at the time of start-up of drive circuit 100b shown in FIG. 4. FIG. 5 also illustrates a waveform diagram when DC power (DC voltage Vd) is supplied from an external power supply to gate drive voltage generator 10b.

Referring to FIG. 5, when external supply of power is started at time ts, DC voltage Vd rises. Before time ts at which supply of power is started, gate drive voltages Vc and Vn have not been generated (Vc=0 and Vn=0) and electrical signal Sct has not been generated either (Sct="0").

In response to supply of DC voltage Vd from time ts, gate drive voltage generator 10b starts generation of gate drive voltages Vc (positive voltage) and Vn (negative voltage). Gate drive voltage Vc thus increases and gate drive voltage Vn lowers. At time tz, gate drive voltage Vc increases to a rated value and gate drive voltage Vn lowers to a rated value.

When gate drive voltage Vn becomes lower than a criterion voltage Vt # (Vt #<0) at time ty (Vn<Vt #), start-up sensor 70 senses start-up of gate drive voltage generator 10b. Throughout the first and second embodiments, when an absolute value of gate drive voltage Vc or Vn exceeds an absolute value of a criterion voltage (positive or negative) set in advance in accordance with a polarity of the gate drive voltage (positive/negative), start-up sensor 70 senses start-up of gate drive voltage generator 10a or 10b.

When start-up sensor 70 senses start-up of gate drive voltage generator 10b, it outputs electrical signal Sct (Sct="1"). During a period from time ts to time ty, electrical signal Sct is not output either (Sct="0") similarly to a period before time ts. Therefore, at the time of start-up of the power supply, switch elements 50 and 60 are controlled in response to sensing of start-up of gate drive voltage generator 10b also in the second embodiment as in the first embodiment.

Consequently, before time ty, gate voltage Vgt is controlled to Vgt=0 owing to short-circuiting between gate 203 and source 202 by normally-on switch element 50. Since gate control signal Sgc="0" is output, gate signal amplifier 20 outputs gate drive voltage Vn of power supply line NL. Therefore, after time ty, a condition of Vgt=Vn (negative voltage) is satisfied.

Thus, also in drive circuit 100b according to the second embodiment, throughout a period before time ty and a period after time ty, gate voltage Vgt does not exceed threshold voltage Vth in response to gate control signal Sgc="0" and semiconductor switching element 200 is maintained in the off state without being falsely turned on. The dead time as in FIG. 3 can also be introduced into the operations by switch elements 50 and 60 at time ty.

In particular, in drive circuit 100b according to the second embodiment, start-up of gate drive voltage generator 10b for switching drive circuit 100b to a normal operation state is determined based on gate drive voltage Vn on the negative bias side for turning off semiconductor switching element 200. Consequently, even when a rate of rise at the time of start-up of the power supply is different between the positive bias side and the negative bias side, false turn-on of semiconductor switching element 200 can reliably be prevented.

In the second embodiment, gate drive voltage generator 10b corresponds to one embodiment of the "drive voltage generator," gate drive voltage Vc on the positive bias side corresponds to the "first drive voltage," and gate drive voltage Vc on the negative bias side corresponds to the "second drive voltage."

Third Embodiment

A power conversion device to which the drive circuits described in the first and second embodiments are applied will be described in a third embodiment.

Figure 6:
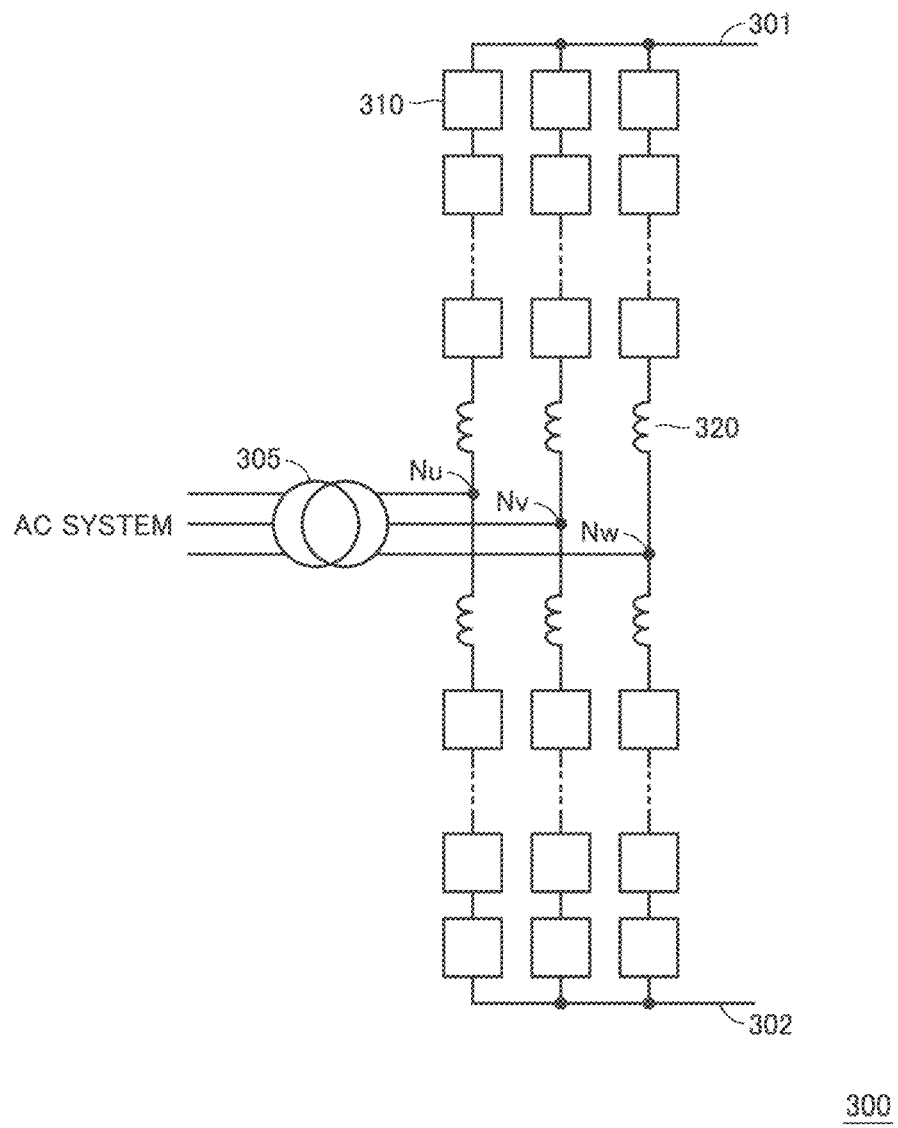
FIG. 6 is a block diagram illustrating an exemplary configuration of a power conversion device according to a third embodiment.

FIG. 6 is a block diagram illustrating an exemplary configuration of a power conversion device according to the third embodiment.

Referring to FIG. 6, a power conversion device 300 according to the third embodiment controls power flow between an AC system and a DC system by interconnecting the AC system and the DC system to each other.

Power conversion device 300 includes a three-phase transformer 305, a plurality of converter cells 310, and a reactor 320. The plurality of converter cells 310 are connected to form six phase arms between DC power lines 301 and 302 of the DC system.

A primary side of three-phase transformer 305 is connected to a not-shown AC system. A secondary side of three-phase transformer 305 is connected to nodes Nu, Nv, and Nw. A plurality of converter cells 310 and reactor 320 that form a U-phase upper arm are connected in series between node Nu and DC power line 301. A plurality of converter cells 310 and reactor 320 that form a U-phase lower arm are connected in series between node Nu and DC power line 302.

Similarly, a plurality of converter cells 310 and reactors 320 are connected in series between node Nv and DC power lines 301 and 302 so as to form a V-phase upper arm and a V-phase lower arm. A plurality of converter cells 310 and reactors 320 are connected in series between node Nw and DC power lines 301 and 302 so as to form a W-phase upper arm and a W-phase lower arm.

Power conversion device 300 thus configured with the plurality of converter cells 310 connected in series is generally called a modular multilevel converter (MMC) and it is applied to applications requiring output of a high voltage.

Figure 7:
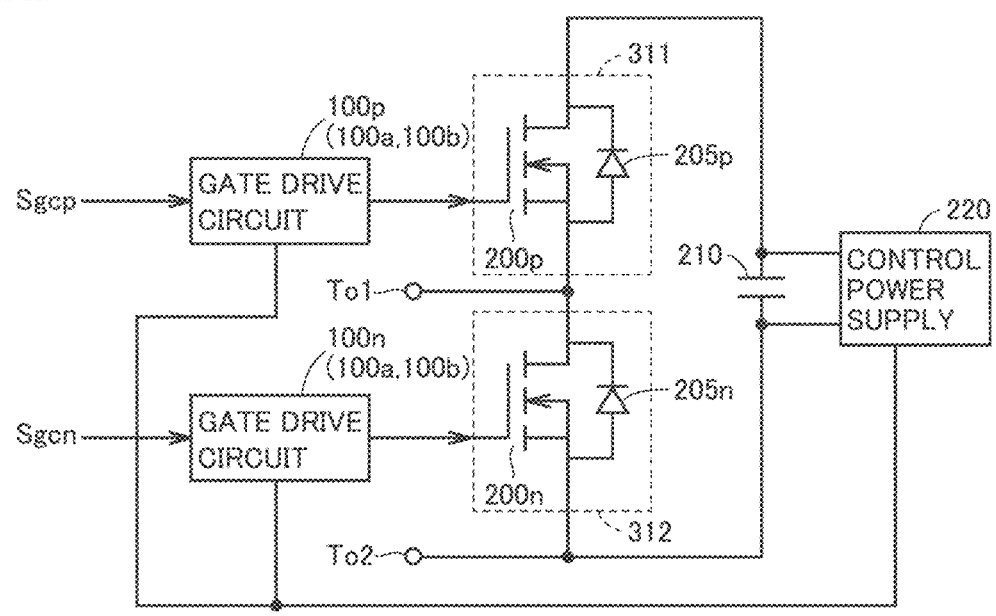
FIG. 7 is a block diagram illustrating an exemplary configuration of a converter cell shown in FIG. 6.

FIG. 7 is a block diagram illustrating an exemplary configuration of each converter cell 310 of power conversion device 300.

Referring to FIG. 7, converter cell 310 includes semiconductor switching elements 200p and 200n connected in series, diodes 205p and 205n, an energy accumulation element 210, drive circuits 100p and 100n, and a control power supply 220. Diodes 205p and 205n are connected in anti-parallel to semiconductor switching elements 200p and 200n, respectively.

An arm 311 is configured with semiconductor switching element 200p and diode 205p and an arm 312 is configured with semiconductor switching element 200n and diode 205n. Though a MOSFET is illustrated as semiconductor switching elements 200p and 200n in an exemplary configuration in FIG. 7, a semiconductor switching element of another type such as an IGBT can also be applied.

Arms 311 and 312 connected in series are connected in parallel to energy accumulation element 210. Output terminals To1 and To2 of converter cell 310 are connected in parallel to arm 312. In the example in FIG. 6, a capacitor is employed as energy accumulation element 210. For example, energy accumulation element 210 can be configured with an electrolytic capacitor or a film capacitor.

Control power supply 220 is connected in parallel to energy accumulation element 210 and supplies electric power to drive circuits 100p and 100n and other control circuits. A scheme for directly supplying electric power for control from a main circuit of converter cell 310 as in control power supply 220 is called self-supply or main circuit power supply. A known technique such as a configuration including a current limit resistor as an input or a configuration including a voltage division capacitor as an input can arbitrarily be applied as a specific configuration of control power supply 220.

Drive circuit 100p controls turn-on and turn-off of semiconductor switching element 200p in accordance with a gate control signal Sgcp and drive circuit 100n controls turn-on and turn-off of semiconductor switching element 200n in accordance with a gate control signal Sgcn. Each of drive circuits 100p and 100n can be configured with drive circuit 100a according to the first embodiment or drive circuit 100b according to the second embodiment.

Gate drive voltage generators 10a and 10b in respective FIGS. 1 and 4 generate gate drive voltage Vc (or Vc and Vn) with a DC voltage supplied from control power supply 220, with control power supply 220 being adopted as the external power supply. Each of gate control signals Sgcp and Sgcn corresponds to gate control signal Sgc input to gate signal amplifier 20 in FIGS. 1 and 4.

In the third embodiment, a part in FIGS. 6 and 7 except for drive circuits 100p and 100n makes up the main circuit for power conversion. In other words, the main circuit includes at least one semiconductor switching element 200 and energy accumulation element 210.

In the power conversion device according to the third embodiment, turn-on and turn-off of the semiconductor switching element can be controlled by using the drive circuit according to the first or second embodiment. Therefore, false turn-on of the semiconductor switching element can reliably be prevented and the semiconductor switching element can operate in a stable manner without occurrence of power loss or defective start-up of the drive circuit at the time of start-up.

Though FIG. 7 illustrates an exemplary configuration in which a chopper circuit is provided as a main circuit configuration including converter cells 310, any configuration of converter cell 310 is applicable, for example, by adopting a full bridge circuit for the main circuit. Furthermore, the configuration of the power conversion device described in the third embodiment is merely by way of example, and the drive circuit according to the first or second embodiment can be applied to drive the gate of the semiconductor switching element that makes up the main circuit, without the configuration of the main circuit of the power conversion device being particularly restricted.

Though a voltage-driven MOSFET or IGBT is described by way of example as the semiconductor switching element to be driven by the drive circuit in the first to third embodiments, the first to third embodiments can also be applied to a control electrode of a current-driven semiconductor switching element (for example, a base of a bipolar transistor). The effect described in the first to third embodiments can be obtained also in this case by short-circuiting a negative electrode and the control electrode of the semiconductor switching element (of the current driven type) by means of switch element 60 until a voltage for driving the control electrode (corresponding to the gate drive voltage) rises, cutting off a current path to the control electrode by means of switch element 50, and interchanging on and off of switch elements 50 and 60 after rise of the voltage.

It should be understood that the embodiments disclosed herein are illustrative and non-restrictive in every respect. The scope of the present invention is defined by the terms of the claims rather than the description above and is intended to include any modifications within the scope and meaning equivalent to the terms of the claims.

REFERENCE SIGNS LIST 10a, 10b gate drive voltage generator (gate drive voltage generation circuit); 20 gate signal amplifier (gate signal amplification circuit); 30 gate resistor; 40a gate output terminal; 40b source output terminal; 50, 60 switch element; 70 start-up sensor (start-up sensing circuit); 100a, 100b, 100n, 100p drive circuit; 200, 200n, 200p semiconductor switching element; 201 drain (positive electrode); 202 source (negative electrode); 203 gate (control electrode); 205n, 205p diode; 210 energy accumulation element; 220 control power supply; 300 power conversion device; 301, 302 DC power line; 305 three-phase transformer; 310 converter cell; 311, 312 arm; 320 reactor; NL, PL power supply line; No output node; Nu, Nv, Nw node; Sct electrical signal; Sgc, Sgcn, Sgcp gate control signal; Td dead time; Vc, Vn gate drive voltage; Vd DC voltage; Vgt gate voltage; Vt, Vt# criterion voltage (gate drive voltage); Vth threshold voltage (semiconductor switching element)

The invention claimed is:

1. A drive circuit that drives a control electrode of a semiconductor switching element comprising:
   a drive voltage generator to generate a drive voltage to be used for driving the control electrode from a voltage supplied from a power supply outside the drive circuit;
   a signal amplifier to amplify a control signal for control of turn-on and turn-off of the semiconductor switching element and outputs the amplified control signal to an amplifier output node;
   a first switch element connected between the amplifier output node and a first side of a resistive element;
   a second side of the resistive element is connected to an output terminal connected to the control electrode;
   a second switch element to short-circuit the output terminal when the second switch element is turned on; and
   a start-up sensor that outputs an electrical signal when the start-up sensor senses start-up of the drive voltage generator,
   the first switch element being configured with a normally-off switch that is turned on while the electrical signal is output,
   the second switch element being configured with a normally-on switch that is turned off while the electrical signal is output.

2. The drive circuit according to claim 1, wherein the start-up sensor outputs the electrical signal when an absolute value of the drive voltage is larger than an absolute value of a predetermined criterion voltage and does not output the electrical signal when the absolute value of the drive voltage is smaller than the absolute value of the criterion voltage.

3. The drive circuit according to claim 1, wherein the drive voltage generator generates a first drive voltage for turning on the semiconductor switching element and a second drive voltage for turning off the semiconductor switching element, and
   the start-up sensor outputs the electrical signal when an absolute value of the second drive voltage is larger than an absolute value of a predetermined criterion voltage and does not output the electrical signal when the absolute value of the second drive voltage is smaller than the absolute value of the criterion voltage.

4. The drive circuit according to claim 1, wherein a dead time is provided such that the second switch element makes transition from on to off after the first switch element makes transition from off to on when the electrical signal is output.

5. The drive circuit according to claim 1, wherein the first switch element is configured with a normally-off semiconductor switch.

6. The drive circuit according to claim 1, wherein the second switch element is configured with a normally-on semiconductor switch.

7. The drive circuit according to claim 1, wherein the second switch element is configured to short-circuit the output terminal by electrically connecting the output terminal and a negative electrode of the semiconductor switching element when the second switch element is turned on.

8. A power conversion device comprising:
   a main circuit including at least one semiconductor switching element; and
   a drive circuit that drives a control electrode of the semiconductor switching element, the drive circuit including
   a drive voltage generator to generate a drive voltage to be used for driving the control electrode from a voltage supplied from a power supply outside the drive circuit;
   a signal amplifier to amplify a control signal for control of turn-on and turn-off of the semiconductor switching element and outputs the amplified control signal to an amplifier output node;
   a first switch element connected between the amplifier output node and a first side of a resistive element;
   a second side of the resistive element is connected to an output terminal connected to the control electrode;
   a second switch element to short-circuit the output terminal when the second switch element is turned on; and
   a start-up sensor that outputs an electrical signal when the start-up sensor senses start-up of the drive voltage generator,
   the first switch element being configured with a normally-off switch that is turned on while the electrical signal is output,
   the second switch element being configured with a normally-on switch that is turned off while the electrical signal is output.

9. The power conversion device according to claim 8, wherein
   the main circuit includes an energy accumulation element, and
   the power conversion device further comprises a control power supply that supplies a voltage to the drive voltage generator of the drive circuit by using energy accumulated in the energy accumulation element.

10. The power conversion device according to claim 8, wherein a dead time is provided such that the second switch element makes transition from on to off after the first switch element makes transition from off to on when the electrical signal is output.

11. The power conversion device according to claim 9, wherein
    the main circuit includes an energy accumulation element, and
    the power conversion device further comprises a control power supply that supplies a voltage to the drive voltage generator of the drive circuit by using energy accumulated in the energy accumulation element.

* * * * *